United States Patent
Ba-Tis et al.

(10) Patent No.: US 9,306,475 B1
(45) Date of Patent: Apr. 5, 2016

(54) PISTON-TUBE ELECTROSTATIC MICROACTUATOR

(71) Applicants: Faez Ba-Tis, Toronto (CA); Ridha Ben-Mrad, Toronto (CA)

(72) Inventors: Faez Ba-Tis, Toronto (CA); Ridha Ben-Mrad, Toronto (CA)

(*) Notice: Subject to any disclaimer, the term of this patent is extended or adjusted under 35 U.S.C. 154(b) by 0 days.

(21) Appl. No.: 14/449,544

(22) Filed: Aug. 1, 2014

(51) Int. Cl.
*H02N 1/00* (2006.01)
*H02N 1/08* (2006.01)

(52) U.S. Cl.
CPC ............. *H02N 1/008* (2013.01); *H02N 1/002* (2013.01); *H02N 1/006* (2013.01)

(58) Field of Classification Search
CPC ........ H02N 1/008; H02N 1/002; H02N 1/006
USPC ....................... 310/300, 309, 12.03
IPC ..................... H02N 11/00, 1/00, 1/08
See application file for complete search history.

(56) References Cited

U.S. PATENT DOCUMENTS

| | | | | |
|---|---|---|---|---|
| 2,247,783 | A * | 7/1941 | Massolle ................. | H02M 7/54 310/112 |
| 6,384,952 | B1 * | 5/2002 | Clark ..................... | G02B 26/06 359/200.6 |
| 7,538,471 | B2 | 5/2009 | Kurozuka et al. | |
| 8,269,395 | B2 | 9/2012 | He et al. | |
| 2001/0048265 | A1 * | 12/2001 | Miller .................... | B81B 3/004 310/309 |
| 2002/0038984 | A1 * | 4/2002 | Jeong et al. ............ | 310/309 |
| 2009/0152980 | A1 * | 6/2009 | Huang ................... | B06B 1/0238 310/309 |
| 2012/0121242 | A1 | 5/2012 | Gutierrez et al. | |
| 2014/0125950 | A1 * | 5/2014 | Shimada et al. ........... | 351/206 |

OTHER PUBLICATIONS

D. T. McCormick, "Gimbal-Less Monolithic Silicon Actuators for Tip-Tilt-Piston Micromirror Applications," IEEE J. Sel. Top. Quantum Electron., vol. 10, No. 3, pp. 462-471, May.
"Large Stroke Staggered Vertical Comb-Drive Actuator for the Application of" J. Microelectromechanical Syst., vol. 22, No. 4, pp. 962-975, 2013.
E. Carr, S. Olivier, and O. Solgaard, "Large-Stroke Self-Aligned Vertical Comb Drive Actuators for Adaptive Optics Applications," SPIE, vol. 6113, p. 61130T-61130T9, Jan. 2006.
R. C. Gutierrez, E. R. Fossum, and T. K. Tang, "Auto-Focus Technology," in the 2007 International Image Sensor Workshop, 2007.
M. Eromäki, "Optical image stabilization," WO 2013076350 A1.
G. D. Grossetete, A. J. Griñe, M. J. Shaw,P. J. Resnick, and B. Jokiel, "Large-Stroke MEMS Deformable Mirrors for Adaptive Optics," vol. 15, No. 3, pp. 572-583, 2006.

(Continued)

*Primary Examiner* — John K Kim
(74) *Attorney, Agent, or Firm* — Nasser Ashgriz; UIPatent Inc.

(57) ABSTRACT

A three-degrees-of-freedom MEMS electrostatic piston-tube actuator is disclosed. The actuator comprises two structures. A structure that comprises a plurality of fixed piston-like electrodes that are attached to a base, and form the stator of the actuator. A second structure that comprises a plurality of moving tube-like electrodes that are attached to the body of the upper structure and form the rotor of the actuator. The rotor is attached to the stator through a mechanical spring. The rotor of the actuator provides a 3-DOF motion, comprising vertical translation and bi-axial rotation about the axes of the structures. The present piston-tube actuator utilizes a configuration that enables the use of wide area electrodes, and therefore, provides a high output force enabling translation of the rotor or a high output torque enabling rotation of the rotor.

14 Claims, 15 Drawing Sheets

(56) References Cited

OTHER PUBLICATIONS

Digital Optics Corporation, "Advances in Autofocus Camera Technologies made possible by MEMS," 2012.

H. S. Ahn, "A precision robot system with modular actuators and MEMS micro gripper for micro system assembly," J. Mech. Sci. Technol., vol. 22, No. 1, pp. 70-76, Apr. 2008.

M. a. Northrup, "A Practical Microgripper by Fine Alignment, Eutectic Bonding and Sma Actuation," Proc. Int. Solid-State Sensors Actuators Conf.—Transducers '95, vol. 2, pp.

S. M. Spearing, "MEMS actuators and sensors: observations on their performance and selection for purpose," J. Micromechanics Microengineering, vol. 15, No. 7, pp. S153-S164, J.

D. A. Henderson, "Micro-Scale Smart Actuator Modules for Imaging Systems," in Actuator 2012, 2012, no. June.

C. Liu, "Electrostatic Actuation," in Foundations of MEMS, Second., 2005, pp. 127-168.

J. Li, "Electrostatic Zipping Actuators and Their Application to MEMS," Thesis, 2004.

\* cited by examiner

PISTON-TUBE ELECTROSTATIC MICROACTUATOR

FIELD OF THE INVENTION

The invention relates to the field of microactuators that provide high force, large out-of-plane translation stroke and/or bi-axial rotation.

BACKGROUND OF THE INVENTION

Large out-of-plane translation and high output force microactuators have a wide range of applications in adaptive optics and in micro robotics. In adaptive optics, they are used for auto-focus [1] and Optical Image Stabilization (OIS) in miniature cameras [2] and deformable micromirrors [3]. For the auto-focus in phone cameras application, the actuator is required to translate a lens of 3 mg in mass along the optical axis for 80 µm [4]. The OIS in phone cameras requires a rotation of a lens barrel of 45 mg mass [2] for 1° about two axes in order to cancel any effects hand-shaking has on the images and recorded video. In micro robotics, large stroke and high output force actuators are used in micro assembly systems and microgrippers [5][6].

Different micro actuation methods are in use. These include electromagnetic, piezoelectric, and electrostatic microactuators. The electromagnetic actuators provide large stroke and high output force; nevertheless, they are known to have a number of disadvantages such as high power consumption and large size [7][4]. Although piezoelectric actuators provide high output force, they are sensitive to temperature and are difficult to fabricate[1][8]. Electrostatic actuators offer high speed response, low power consumption, and small size [9][7][4]. However, it is challenging to design electrostatic actuators that can simultaneously provide high output force, large out-of-plane stroke and while maintaining a low voltage [10].

The electrostatic actuators that provide an out-of-plane stroke include parallel plate and Vertical Comb-Drive (VCD) actuators. The former suffers from the pull-in effect which limits the vertical stroke of the actuator to one third of the initial gap between the plates [9]. The latter could be divided into two types: rotational and translational (piston-style) VCD actuators.

In rotational comb-drive actuators (including staggered and angular VCD actuators), the original motion of the rotor is a rotation, thus providing a rotational out-of-plane stroke; however, these actuators often utilize mechanical amplification mechanisms, such as levers, to enlarge the stroke as well as to transform the original rotary motion of the rotor into a translation of the load. Due to the motion amplification and transformation, the output torque of the actuator acting on the load is generally lower than the one generated. Different designs of rotational VCD actuators have been developed. For example, a rotational VCD actuator developed by V. Milanovic et al. [11] achieved a vertical deflection of 60 µm (corresponding to an angle of rotation of 20°) at 150 V. It utilizes a cantilever for mechanical amplification. Li et al. [12] developed a rotational (staggered) VCD actuator that achieved a vertical deflection of 180 µm at 35 V. A plate was attached to the free comb of the actuator to achieve the large rotational stroke while reducing the output torque.

U.S. Pat. No. 8,358,925 B2 [13] discloses an invention of a rotational comb-drive actuator that is used to translate a lens along the optical axis (z). The original motion of the rotor is an out-of-plane rotation which is transformed (with the assistance of similar actuators surrounding the lens) into a vertical deflection of the lens using a complex transformation mechanism. A significant amount of the rotor torque is dissipated during the transformation of the motion. Due to the complexity of the structure of the rotor of this actuator, an undesirable tilt occurs during the translation of the lens when it is actuated by a number of similar actuators. This tilt needs a motion controller to be eliminated.

U.S. Pat. No. 8,269,395 B2 [14] discloses a large stroke rotational comb-drive actuator. It works on the repulsive force principle, and the rotor of the actuator achieves an 86 µm vertical deflection at 200 V based on a rotational stroke at each of the four edges of the actuator which is then amplified using a cantilever beam; however, it provides a low output torque due to use of an amplification mechanism and to the small area of the fingers used to generate the force.

In translational VCDs, the original motion of the rotor is a translation, and the total electrostatic force that is developed between the electrodes is directly applied to the load attached to the rotor without the use of any stroke amplification or transformation mechanism. A number of translational VCD actuators were developed. A translational VCD actuator, developed by V. Milanovic et al., achieved a translation stroke of 15 µm at 140 V. The actuator is fabricated using a Direct Reactive Ion Etching (DRIE) of an SOI wafer which enables the fabrication of large height electrodes; however, it provides a low output force as the comb electrode configuration is not area-efficient in terms of overall electrode capacitance. That is because the rotor of the actuator consists of two arrays of fingers (each array is formed along one side of the rotor). The number of fingers in these two arrays can be increased only along one direction, i.e. the lateral direction of comb fingers [11]. A self-aligned translational VCD actuator [15], developed by E. Carr et al., was able to achieve a stroke of only 1.4 µm due to the high stiffness of the supporting beams along the z-axis (out-of plane axis) and due to the low output force that can be generated by the actuator which is attributed to the area-inefficient configuration as is the case in the previous translational VCD actuators [11].

U.S. Pat. No. 6,384,952 B1 [16] discloses a translational vertical comb-drive actuator used to actuate a deformable mirror. The actuator has a cavity-tooth configuration which enables achieving a wide area for the electrodes, and it provides an out-of-plane translation of 20 µm at 100 V; however, the actuator provides only 1 degree of freedom (DOF) motion, i.e. vertical translation. The differences in the translations of the VCD actuators beneath the mirror surface result in a bi-axial rotation of the mirror surface. In other words, the comb-drive actuators have only 1-DOF motion which is a translation along the z-axis, whereas the mirror surface itself has a 3-DOF motion, i.e. translation along the z-axis, and bi-axial rotation about the in-plane axes (x and y). A limitation of this actuator is that the tooth-cavity configuration requires the rotor and the stator of the actuator to be fabricated separately. The fabricated rotor and stator wafers are then bonded together which may lead to a misalignment of sub-microns size between the upper and lower electrodes. This misalignment limits the stroke of the actuator. The cavity-tooth configuration also leads to gas damping effect between the comb electrodes as gas is trapped between the tooth and the corresponding cavity during motion of the actuators. This trapped gas has only one outlet (exit) during the actuation, which is the gap between the moving and fixed fingers. This gap is usually very small in size as compared to the finger width.

U.S. Pat. No. 7,538,471 B2 [17] discloses a vertical comb-drive actuator configuration that provides an increased rigidity to the optical surface. The goal of the invention is to overcome the problem of optical surface deformation that ensues from the deposition of a reflective metal such as gold or aluminum on the optical surface to enhance its reflectivity. The invention eliminates this problem by reinforcing the comb electrodes beneath the reflected surface in more than one direction. The actuator provides 3-DOF motion, i.e. translation along the z-axis and bi-axial rotation about the in-plane axes (x and y), without the use of any stroke amplification mechanism. It also provides a considerable large output force due to the ability of the electrode configuration to be expanded in more than one dimension. The actuator is fabricated using a surface micromachining process in which the height of the comb electrodes is limited due to the nature of the layer deposition process. These layers cannot be of a large height (thickness), which leads to a limitation on the out-of-plane translation of the actuator. In addition, the comb electrodes have a tooth-cavity configuration that contributes to appreciable damping effects, similar to the issue listed in conjunction with U.S. Pat. No. 6,384,952 B1.

A recent U.S. Pat. No. 8,711,495 discloses a MEMS autofocus mechanism that utilizes three or more translation vertical comb-drive actuators to achieve autofocus in phone cameras. The goal of this invention is to increase the resistance of MEMS Autofocus structure to shocks that occur during the drop test of the mobile phone. The drawbacks of this actuation mechanism include inefficient area-electrode layout, as it utilizes single array comb-drive actuators distributed around the lens, meaning a higher driving voltage is required; limited out-of-plane translational stroke, as the maximum height (thickness) of the electrodes is 20 microns; and low resonant frequency, as the supporting beams have to buckle during the loading of the lens to the central ring to provide an offset between the comb fingers.

In summary, the prior art translational (piston-style motion) VCD actuators have limited performance as they are unable to achieve simultaneously a large output force and a large stroke due to one or more of the following reasons:

(1) Inefficient electrode configurations of the conventional VCD actuators in which the comb fingers have an array-style structure. This structure allows multiplying the number of the fingers only in one dimension along the lateral axis of the fingers; therefore, it leads to generating a low output force. In other words, the comb fingers are essentially free-end cantilevers; hence they cannot be largely elongated along the longitudinal axis to increase the output force. Therefore, the output force can be increased by multiplying the comb fingers only along the lateral axis of the comb fingers.

(2) Bonding misalignments between the rotor and stator electrodes might arise if a translational VCD actuator with a cavity-tooth configuration is fabricated using a bulk micromachining fabrication process.

(3) Significant damping effects in the cavity-tooth configuration of the comb electrodes used in a number of designs that limit the bandwidth of the actuator.

(4) Surface micromachined VCD actuators are limited in terms of being able to provide a large translational (piston-style) stroke. This limitation is due to the inability of surface micromachining processes for depositing large height (thickness) layers.

SUMMARY OF THE INVENTION

In order to overcome the previously listed problems associated with VCD actuators, a novel electrostatic actuator that utilizes a piston-tube type configuration is developed. The actuator consists of two structures: a fixed one and a moving one. The fixed structure contains a plurality of electrodes which act as pistons in a piston-tube type system. The pistons may be arranged in square, circular, or any other configuration. These pistons are attached to a base (i.e. the base surfaces on which the piston are positioned define the xy plane) and protrude in a perpendicular direction to it (i.e. along the z-axis), and they form the stator of the actuator. The moving structure contains a plurality of tubes (through holes) that have cross-sections similar to the cross-sections of the pistons. The moving tubes surround an actuator plate, and they are suspended by three or more supporting springs used to return the actuator plate to its initial position in the absence of an applied voltage. The pistons can be divided into three or more groups that are electrically separated from each other to provide bi-axial rotation about the in-plane axes (x and y).

When a voltage is applied across the rotor and all of the stators, an electrostatic force develops between the adjacent pistons and tubes in the vertical direction. This electrostatic force moves the rotor (the free moving structure) from its static position towards the stators (the fixed structure) in a pure translation (piston-style) motion along the z-axis. When the voltage drops, the rotor moves back to its equilibrium position due to the restoring force in the supporting springs. To rotate the rotor of the actuator about the x and/or y axes, a voltage is applied across the rotor and only one or more stators.

The advantages of the present invention compared to the prior art are as follows:

(1) The piston-tube configuration enables the use of a wide area for the electrodes. Therefore, a high output force in the translation mode (or a high torque in rotation mode) can be generated.

(2) The piston-tube configuration significantly reduces the gas damping effects between the actuator electrodes, which is an inherent issue of the cavity-tooth configuration actuators listed previously. That is because no gas is trapped between the pistons and the tubes when they engage during the motion as the tubes are through holes. Squeeze thin-film damping is still present in one embodiment of this actuator, but it can be eliminated by back etching of the fixed structure (the base) to create a central through hole beneath the actuator plate.

(3) The design enables the fabrication of actuator electrodes with an accurate alignment. That is due to the fact that the rotor tubes are patterned and etched after the bonding of the rotor layer (moving structure) to the etched stator layer (fixed structure) using double sided alignment. This technique leads to an accurate alignment between the adjacent pistons and tubes.

(4) The piston-tube configuration with double stator embodiment (two stators bound to the rotor from its two sides that are parallel to the base) enables bi-directional translation of the rotor along the z-axis so that the stroke of the actuator is doubled.

(5) The piston-tube actuator provides 3-DOF motion, i.e. translation along the z-axis, and bi-axial rotation about the x and y axes.

These advantages can be further described through information presented in the following sections.

BRIEF DESCRIPTION OF DRAWINGS

Embodiments herein will hereinafter be described in conjunction with the appended drawings provided to illustrate and not to limit the scope of the claims, wherein like designations denote like elements, and in which:

DETAILED DESCRIPTION OF THE INVENTION

A MEMS electrostatic microactuator, comprising of a first base plate having a top surface and a thickness; a cavity constructed at the center of the top surface of the base plate sized to receive an actuator plate; an array of spaced apart pistons electrodes constructed in the thickness of said base plate, wherein said array of pistons electrodes surrounding said cavity, wherein said cavity being a closed or an open cavity; each said piston electrode having a shape, a length, a height, and a thickness; said array of pistons being grouped in one or multiple sub-arrays of pistons each comprising one or more pistons, wherein the pistons in each sub-array of pistons being electrically connected to each other and electrically isolated from other sub-array of pistons; each sub-array of pistons being electrically addressable, whereby each sub-array of pistons forms a stator of said actuator; a second plate attached to said base plate and having a structure sized to fit on said base plate, said second plate having a fixed peripheral structure and a moving central structure, whereby the fixed structure being attached to the base plate and the moving central structure holding the actuator plate; an array of spaced apart open tubes constructed in the thickness of said second plate; said array of open tubes sized and designed to receive and interdigitate with said array of pistons, each said open tube having a length, width and a height; said array of open tubes being grouped into one or multiple sub-arrays of open tubes that each comprises of one or more open tubes. The open tubes being electrically connected to each other; each sub-array of open tubes being supported by one or more supporting beams extended from the fixed peripheral structure of the second plate to hold them aligned with respect to said array of pistons, whereby each sub-array of open tubes forms a rotor of said actuator; and a plurality of spring means extended along the peripheral structure of said second plate to attach each said rotor to said peripheral structure, and to return the rotor to its initial position in the absence of a driving voltage, each said spring having a length, a thickness, and a height, whereby the pistons of the stators penetrate into the open tubes of the rotors during the actuation in response to electrostatic forces from a drive voltage applied between said stators and rotors, and a 3-DOF actuation being achieved by selectively charging each sub-array of pistons (stators) and open tubes (rotors).

Figure 3A:
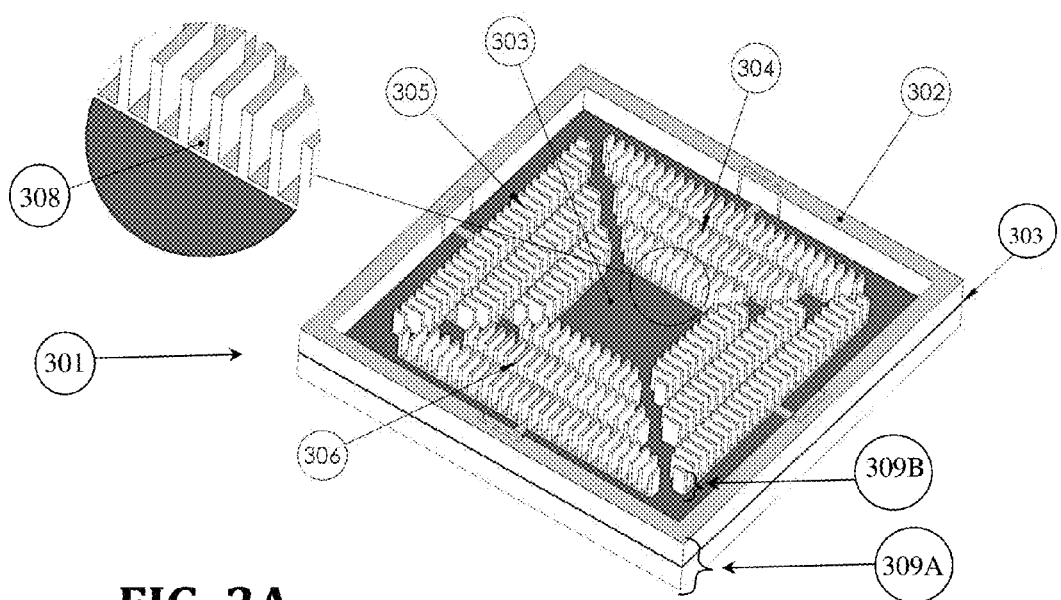
FIG. 3A is a perspective view illustrating the fixed structure (pistons) of Embodiment 3 of the 3-DOF piston-tube electrostatic actuator.
Figure 3B:
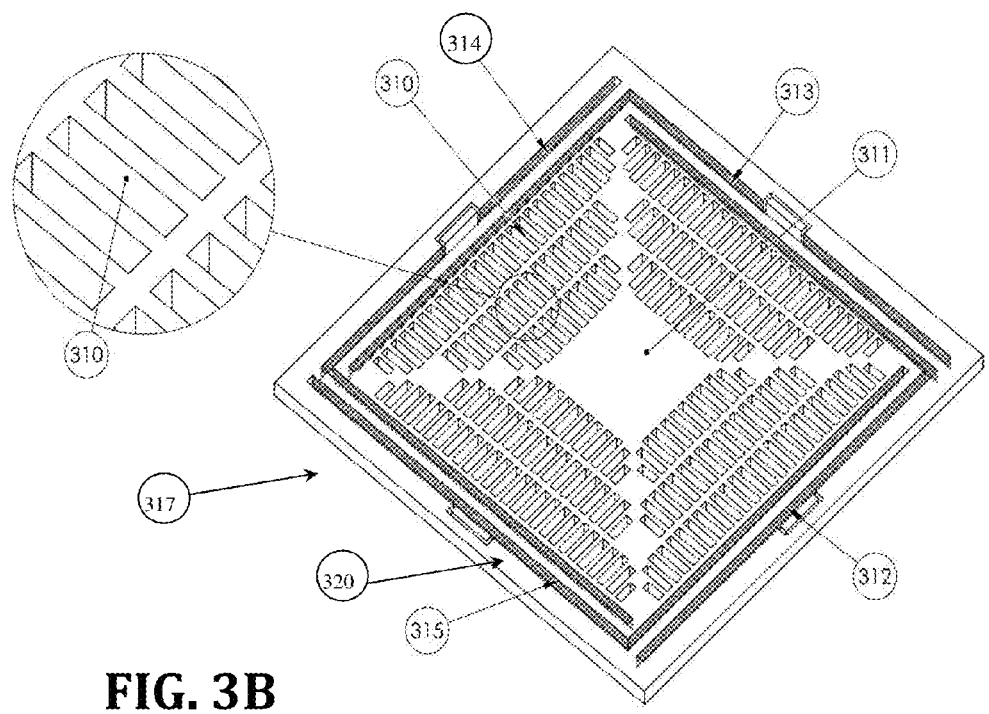
FIG. 3B is a perspective view illustrating the moving structure (tubes) of Embodiment 3 of the 3-DOF piston-tube electrostatic actuator.

It is apparent to one skilled in the art that the pistons and the corresponding tubes can have many different shapes and designs. For example, the pistons and the tubes can be square, rectangular, circular, or arc-shaped cross-sections (the cross-section plane is parallel to the base stator plate surface). It is also apparent to one skilled in the art that the springs or the supporting beam configuration can be designed in different arrangements without departing form the spirit of the present invention. These configurations may include suspension beams that extend radially inward towards the center of the actuator plate. Other configurations may include springs or supporting beams that extend along the outer periphery of the moving structure and hold it, or attach it to the fixed periphery (nonmoving rotor-support-frame) of the upper structure (rotor plate), similar to the beam configuration shown in FIG. 3A-C.

Embodiment 1

A first embodiment of the present invention (3-DOF MEMS electrostatic actuator) is illustrated in FIG. 1. The actuator comprises of a fixed structure, as illustrated in FIG. 1A, that comprises of a plurality of co-centric arc-shaped pistons 102, 103, 104, fabricated in the thickness 109 of a Si wafer 101. The actuator further comprises of a moving structure that comprises of a plurality of co-centric arc-shaped open tubes 122 (FIG. 1B). The tubes are sized and designed to receive the pistons of the fixed structure.

The arc-shaped pistons are divided into three groups 102, 103, 104 that are arranged at 120°. Each group forms one stator of the actuator The pistons are vertically aligned with the arc-shaped open tubes 122 in the rotor. During the actuation, the pistons enter into the tubes and they inter-digitate during the actuation. The three stators 102, 103, 104 are electrically isolated from one another by utilizing the Buried Oxide (BOX) layer 107 of the SOI wafer. However, the electrodes of each stator are electrically connected to each other via a small thickness (height) layer 106 above the BOX layer. The fixed electrode 101 further comprises of three electrical pads 105 that surround the pistons.

Figure 1A:
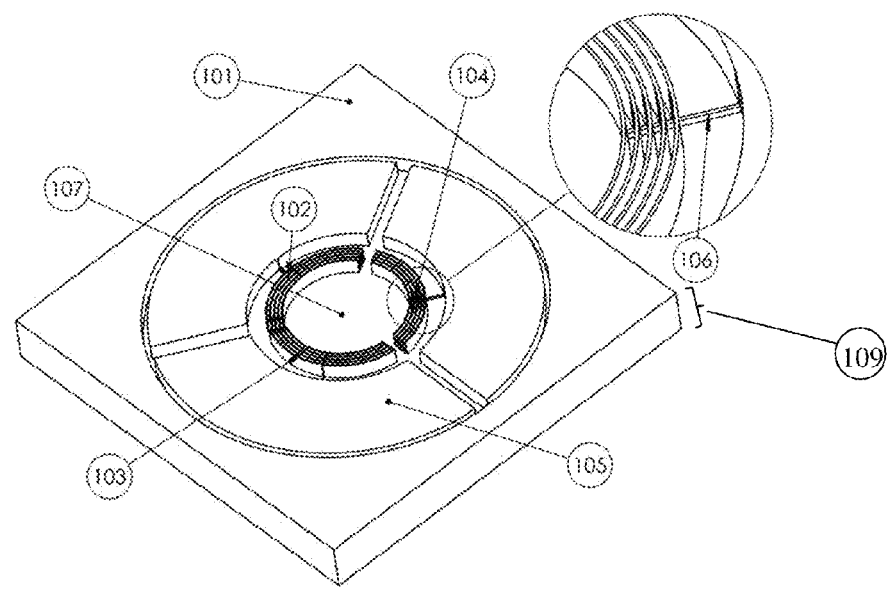
FIG. 1A illustrates the fixed structure (pistons) of Embodiment 1 of the 3-DOF piston-tube electrostatic actuator.
Figure 1B:
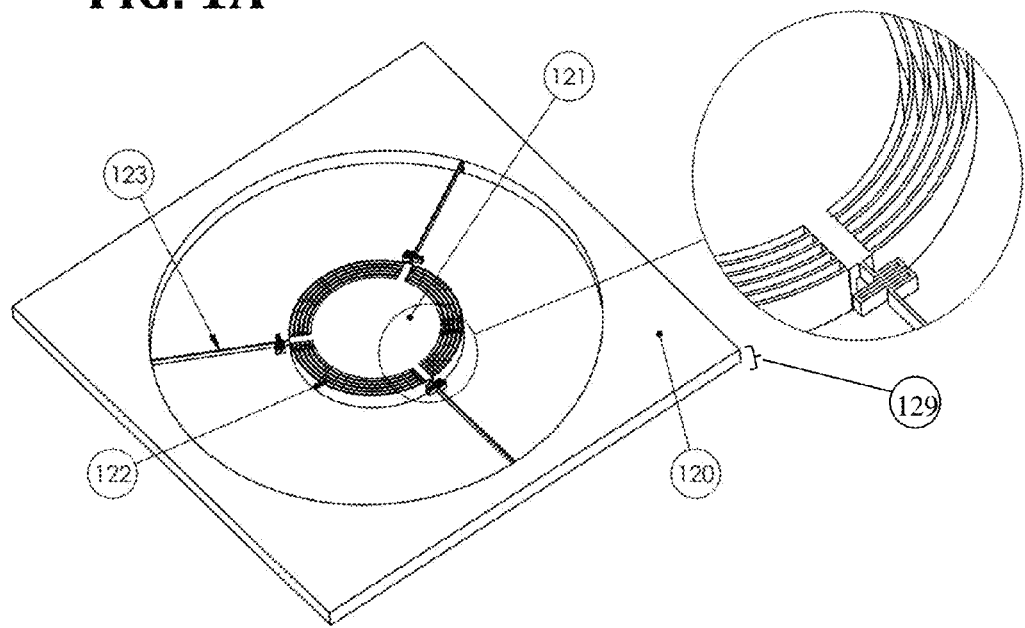
FIG. 1B illustrates the moving structure (tubes) of Embodiment 1 of the 3-DOF piston-tube electrostatic actuator.
Figure 1C:
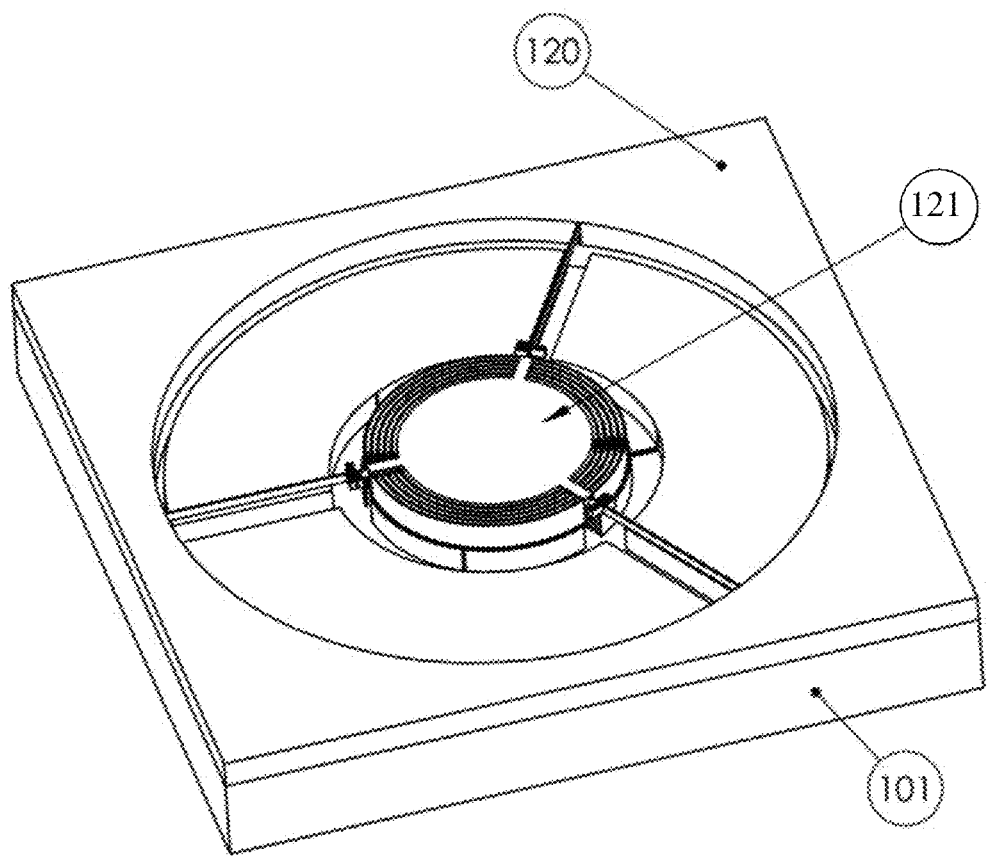
FIG. 1C is a perspective view illustrating the final structure of Embodiment 1 of the 3-DOF piston-tube electrostatic actuator.
Figure 1D:
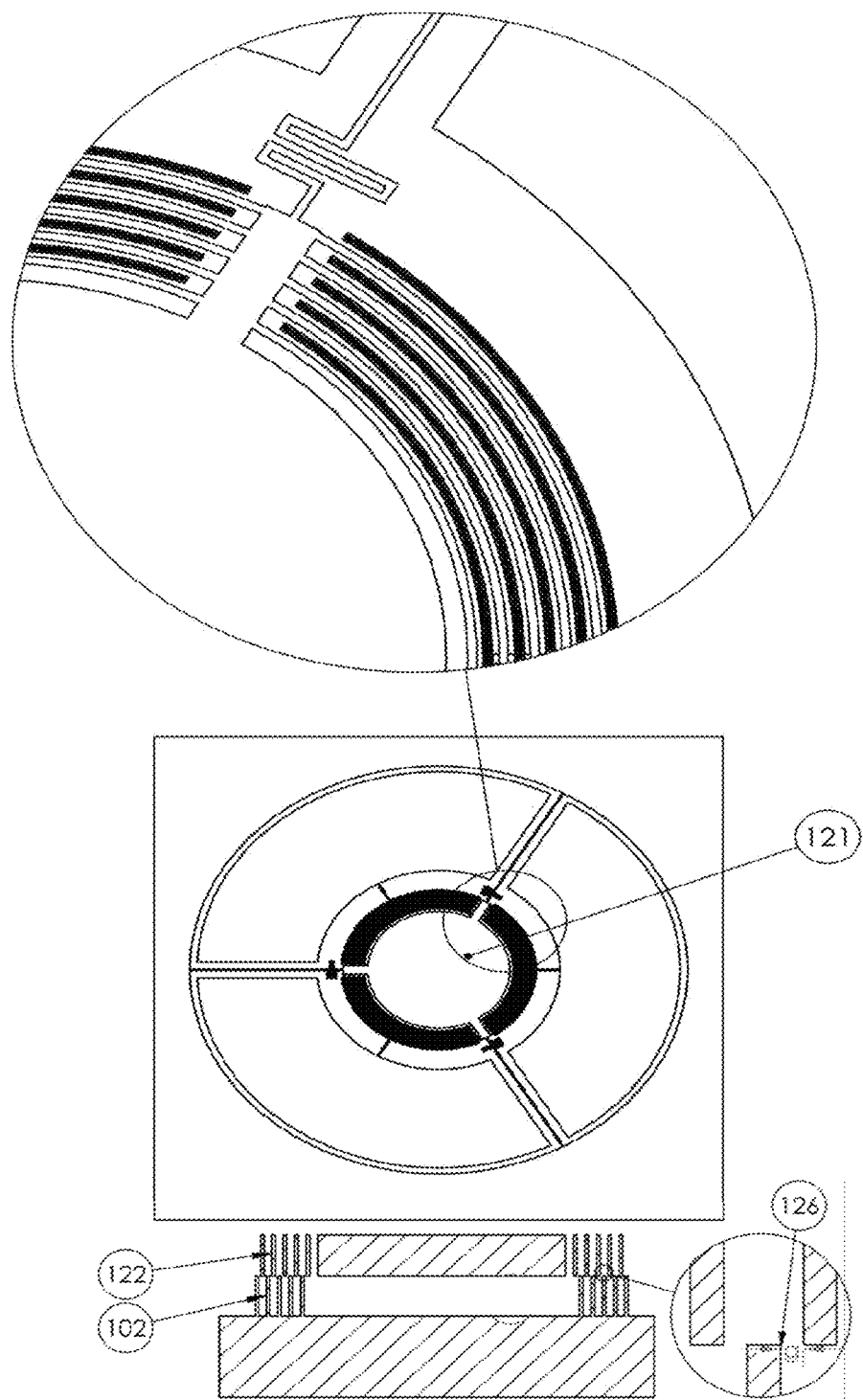
FIG. 1D illustrates a top, detailed view, and a cross-section view of the final structure of Embodiment 1 of the 3-DOF piston-tube electrostatic actuator.
Figure 2A:
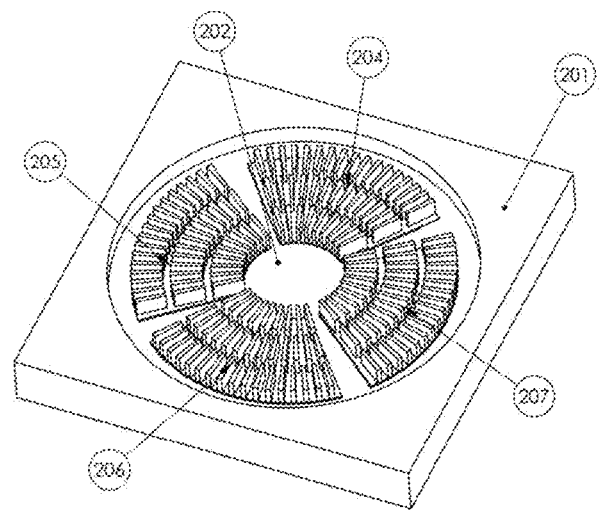
FIG. 2A is a perspective view illustrating the fixed structure (pistons) of Embodiment 2 of the 3-DOF piston-tube electrostatic actuator.
Figure 2B:
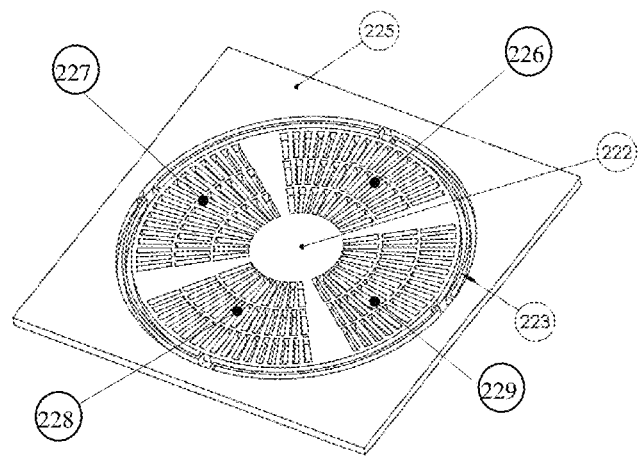
FIG. 2B is a perspective view illustrating the moving structure (tubes) of Embodiment 2 of the 3-DOF piston-tube electrostatic actuator.
Figure 2C:
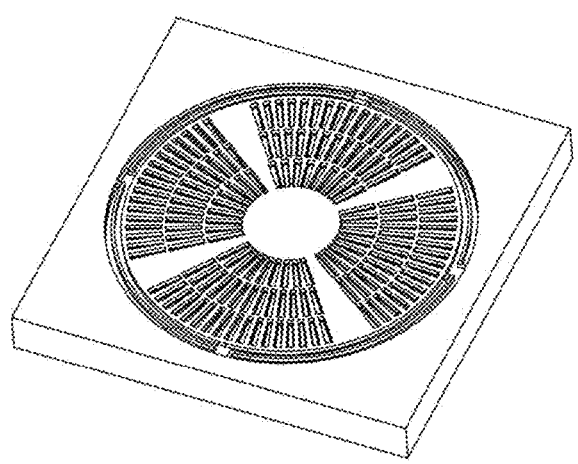
FIG. 2C is a perspective view illustrating the final structure of Embodiment 2 of the 3-DOF piston-tube electrostatic actuator.
Figure 2D:
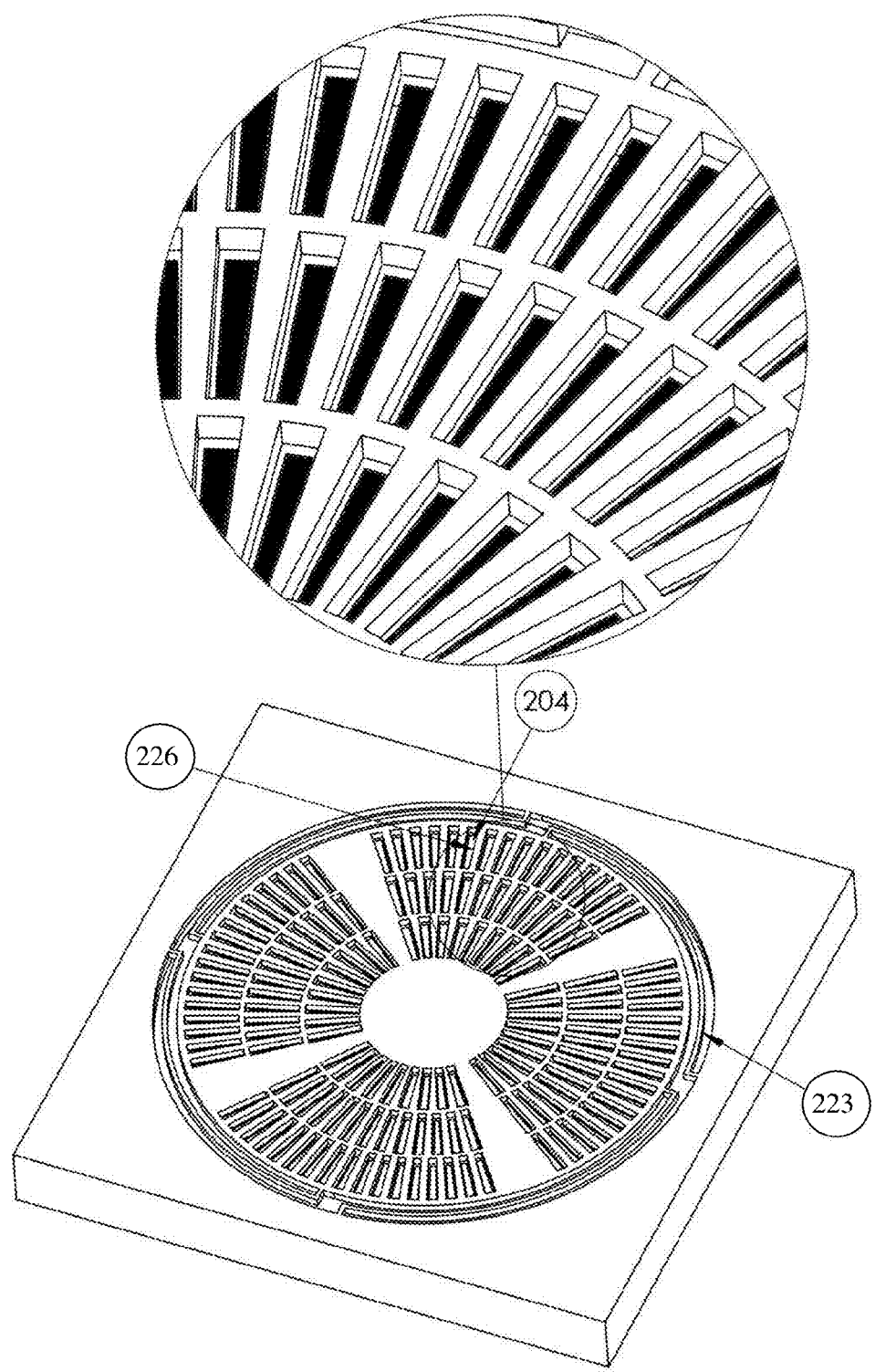
FIG. 2D illustrates a top, detailed view of the final structure of Embodiment 2 of the 3-DOF piston-tube electrostatic actuator (i.e. black structure within the tubes represent the pistons).

The rotor or the moving electrode is fabricated in the device layer of another Si wafer having a thickness 129, and it comprises a plurality of arc-shaped tubes 122 that surround the actuator plate 121, as illustrated in FIG. 1B. The tubes are attached to the substrate by three supporting beams 123. The final bonded structure of the actuator is shown in FIG. 1C in which the rotor 120 is set on the top of the stator 101. FIG. 1D shows the top view of the actuator, and the detailed view, which shows how the pistons (black) and tubes (white) are positioned with respect to each other.

Although this embodiment of the actuator provides a 3 DOF motion, it is limited in terms of achieving large rotational angles. This limitation is due to the fact that the horizontal gap (g) 126 between the pistons and the tubes changes as the rotation angle increases, which makes this design improper for providing large rotation angle; however, it is a good design for providing a large translational stroke.

This embodiment was fabricated using a Direct Reactive Ion Etching (DRIE) bulk micromachining process of SOI wafers. The DRIE of bulk silicon, unlike surface micromachining processes, enables the fabrication of large thickness (height) electrodes that, in turn, enables the actuator to provide a large stroke. The BOX layer of the SOI wafer provides the electrical separation between the stators of the actuator to enable bi-axial rotation.

Embodiment 2

Another embodiment of the present actuator is illustrated in FIG. 2. In this embodiment the piston and tubes are aligned radially. The electrodes of the stator 201 and the rotor 225 are arranged in such a way that reduces changes in the gap 126 during rotation. The pistons 204, 205, 206, 207 in this embodiment are fabricated in a Si wafer 201, as plurality of pistons extending vertically upward from the bottom surface of the Si wafer 202, illustrated in FIG. 2A, extend radially from the inside to the outside periphery of the actuator. In this embodiment, the pistons are divided into four groups 204, 205, 206, 207, each being a stator. Similarly, the open tubes are fabricated in another Si wafer 225, as illustrated in FIG. 2B. The open tubes are also fabricated in four different groups 226, 227, 228, 229, that make the rotor of the actuator. The tubes are fabricated in the thickness of the wafer 225 around an actuator plate 222. The rotors are connected to the outer edges of the wafer by springs or connectors 223. The tubes in are all electrically connected to each other. The combined stator-rotor actuator of this embodiment is illustrated in FIG. 2C. The parallel plate capacitances between the sides of the pistons and tubes extend in the radial direction of the circular plate of the actuator. Therefore, a negligible change in the horizontal gap (g) 126 is expected during rotation of the actuator for those charged piston-tube pairs that are perpendicular or almost perpendicular to the axis of rotation. These charged piston-tube pairs also generate an almost linear torque versus voltage. This is especially true when the stator layer is segmented into a large number of stators, see FIG. 2D. Although the present embodiment illustrates in FIG. 2D has 4 stators actuator, the stator layer can be segmented into multiple stators. That enables this embodiment of the actuator to achieve a large rotation angle before experiencing any pull-in instability as compared to Embodiment 1. Another advantage of this embodiment is that the parallel plate capacitors formed by the pistons and the tubes are normal to the longitudinal direction of the springs, which is the direction of the highest stiffness of the springs 223 (the longitudinal direction of the springs lies on a tangential direction to the actuator plate). Thus, a large out-of-plane translation stroke could be achieved. Another aspect of this embodiment is the configuration of the springs with respect to the rotor, in which the springs are extending along the peripheral of the rotor (see FIG. 2B versus FIG. 1B). This configuration of the springs has four advantages. First, it allows springs to be largely long (leads to having a high ratio of the longitudinal stiffness to the transverse stiffness as the longitudinal stiffness of the beams is inversely proportional to the length and the transverse stiffness is inversely proportional to the length cube). This high value of the ratio pushes the lateral instability limit further, so a large stroke could be achieved. The second advantage is that it provides a wide room for electrodes to be multiplied as opposed to the spring configuration of embodiment 1, see FIG. 1, in which the springs are extending radially inwards leading to the shrinkage of the area of the rotor. Third, the springs could have the same thickness as the rotor (tubes) layer, meaning the fabrication step needed for etching the rotor layer to soften the spring could be eliminated, which simplifies the fabrication process. Fourth, springs with large height (thickness), similar to the electrodes height, make the MEMS electrostatic actuation more resistant to shock when loaded with a mass such as a lens.

Embodiment 3

Another embodiment of the actuator is illustrated in FIG. 3. The subarray of pistons 304, 305, 306, 307 in this embodiment have rectangular cross-sections, and they are etched inside the base plate 301. This plate is fixed and it is therefore the stator of the actuator. A supporting frame 302 is kept around the pistons to later attach the rotor plate to. The base plate has a thickness 309A and the pistons have a length (height) 309B. Pistons extend vertically upward from the bottom of the base plate where the insulating layer 303 is located. The piston length 309B is smaller than the thickness of the plate 309A. In this embodiment, the pistons are made in four groups, each group comprising of three rows of pistons, extending horizontally along the two in-plane x and y axes The pistons in each stator are electrically connected to each layer through a small thickness layer 308. The pistons in each subarray are electrically insulated from other subarrays. It would be readily apparent to the one skilled in the art that this step is achieved by having an insulating layer beneath the stators so that it electrically separates the pistons from each other. Only the pistons in the same subarray are electrically connected by leaving a small section 308 in between them during the fabrication process.

Figure 3C:
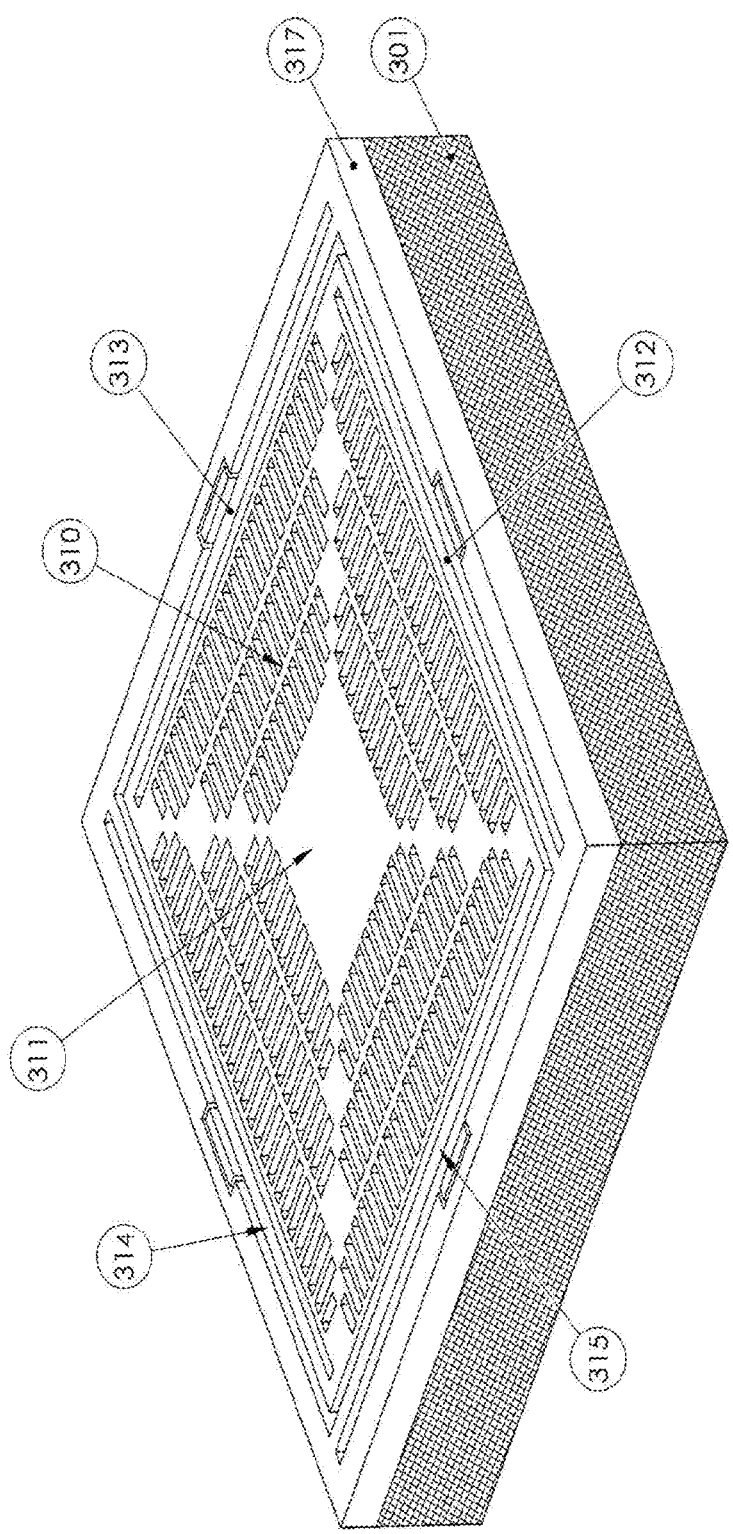
FIG. 3C is a perspective view illustrating the final structure of Embodiment 3 of the 3-DOF piston-tube electrostatic actuator.
Figure 3D:
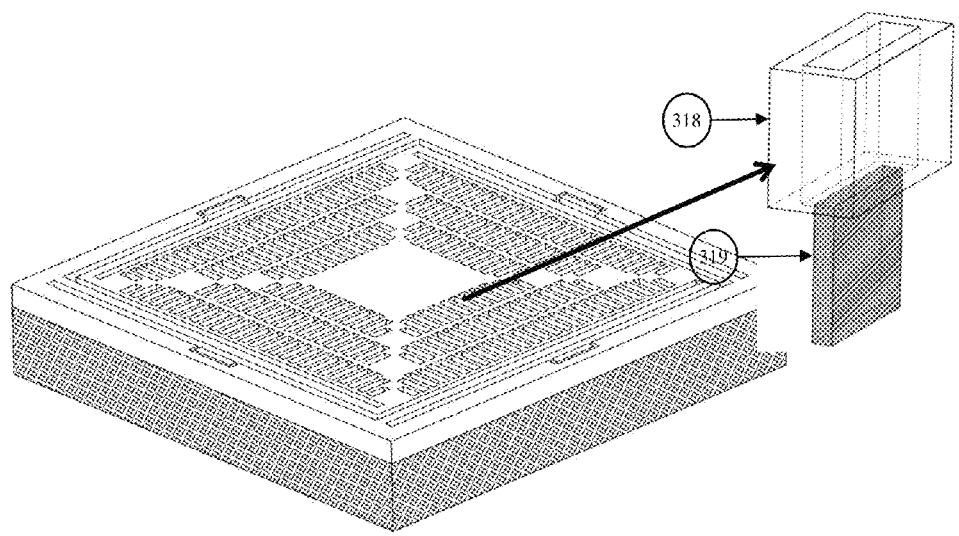
FIG. 3D is a perspective view illustrating the final structure of Embodiment 3 and a magnified image of an aligned piston-tube system prior to actuation.
Figure 3E:
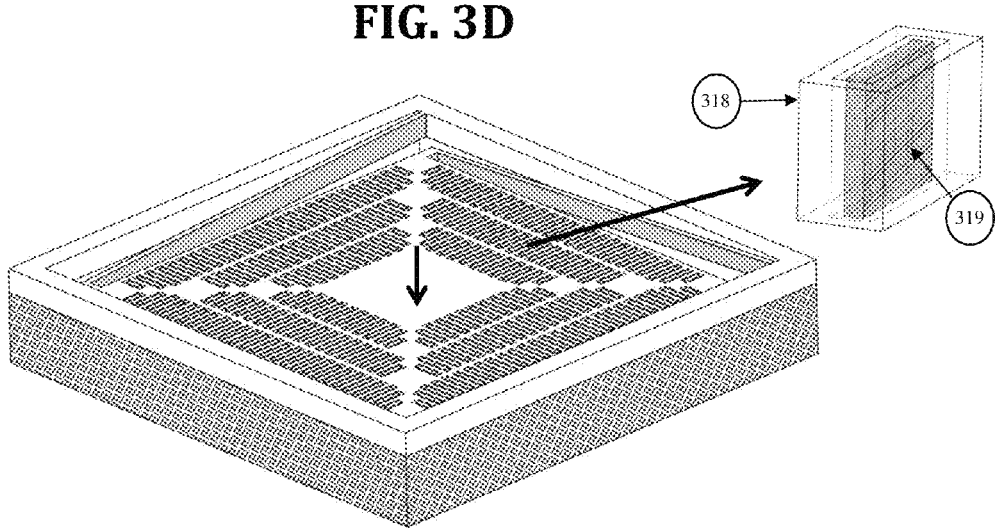
FIG. 3E is a perspective view illustrating the final structure of Embodiment 3 and a magnified image of an aligned piston-tube system after actuation when the piston has entered the tube.
Figure 3F:
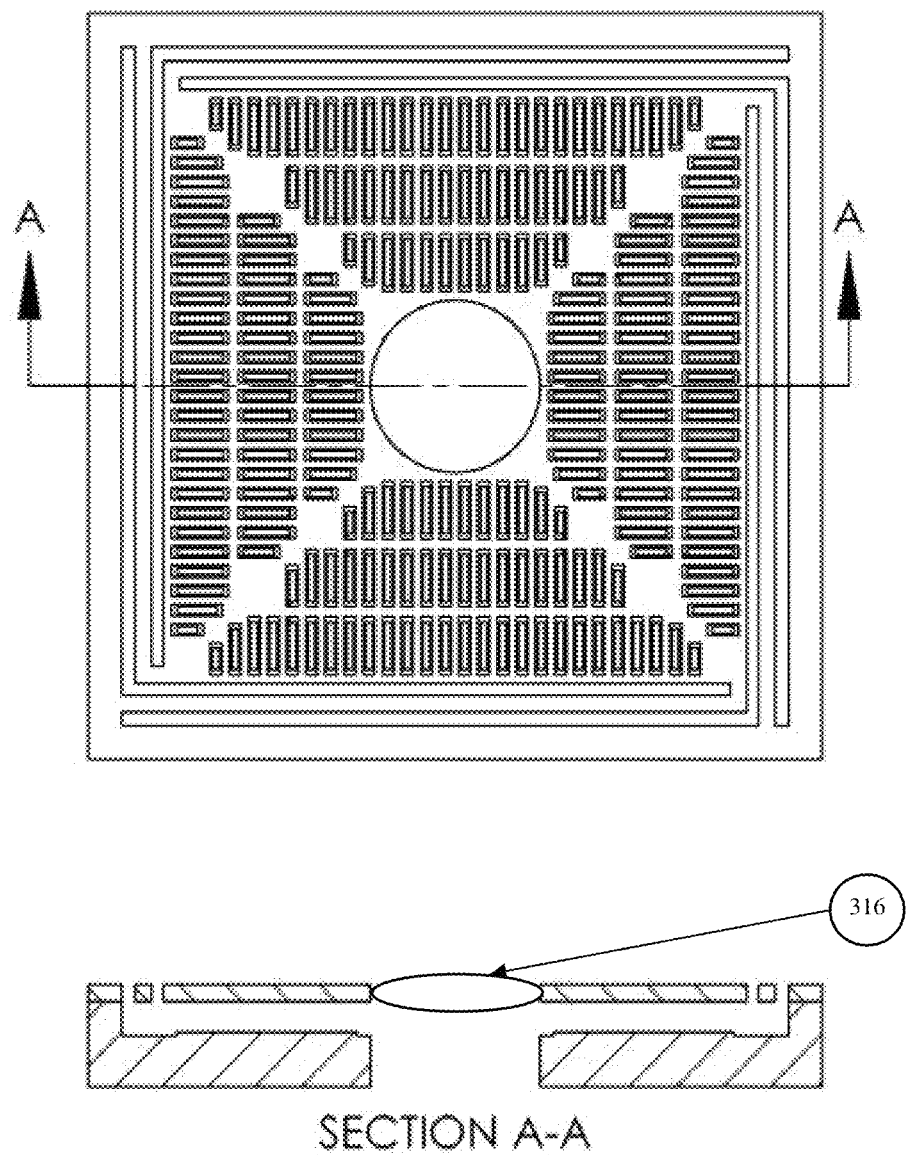
FIG. 3F is a to and a cross-sectional view of Embodiment 3 showing the location of a lens that is being actuated.
Figure 4A:
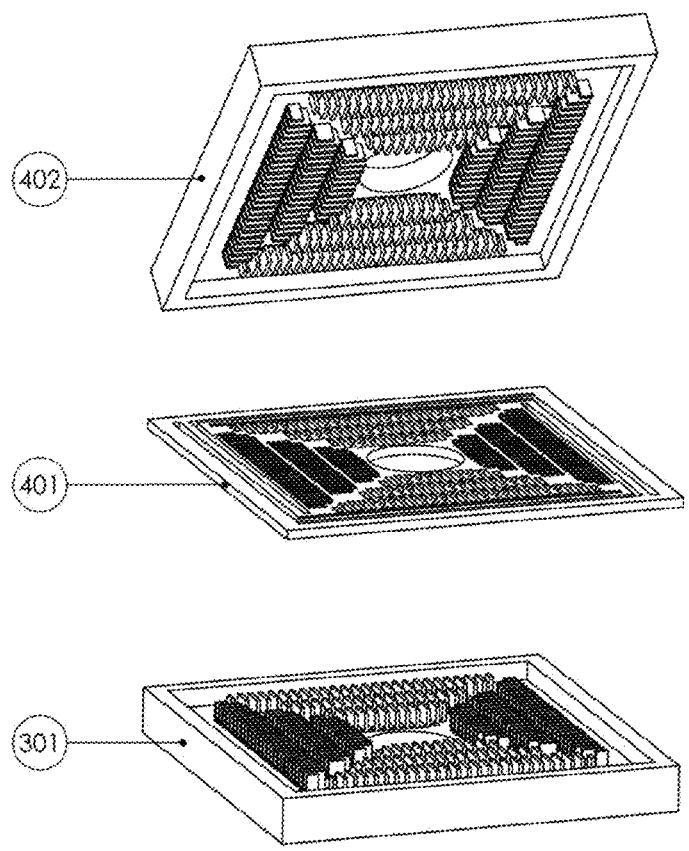
FIG. 4A is an exploded view of Embodiment 4 (double stators version) of the 3-DOF piston-tube electrostatic actuator illustrating the lower fixed base containing pistons, the rotor containing the tubes, and the upper fixed base containing pistons.
Figure 4B:
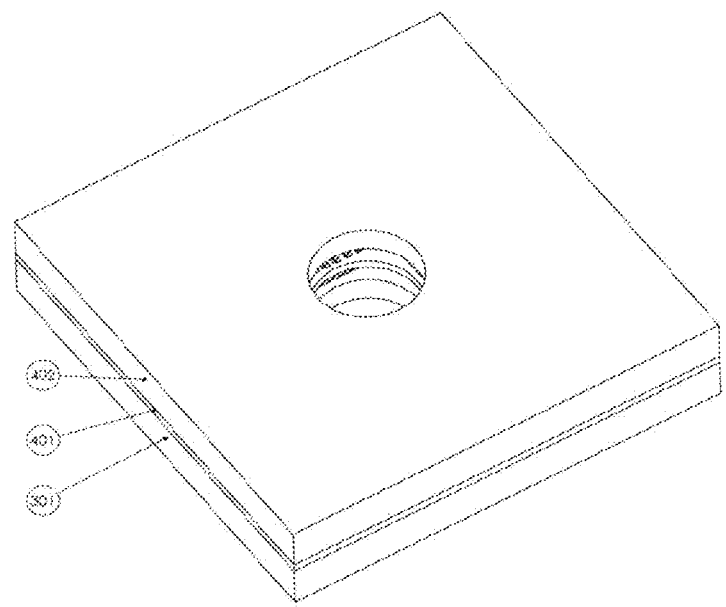
FIG. 4B is a perspective view of Embodiment 4 (double stators version) of the 3-DOF piston-tube electrostatic actuator illustrating the final form of the actuator after the bonding of the three structures.
Figure 4C:
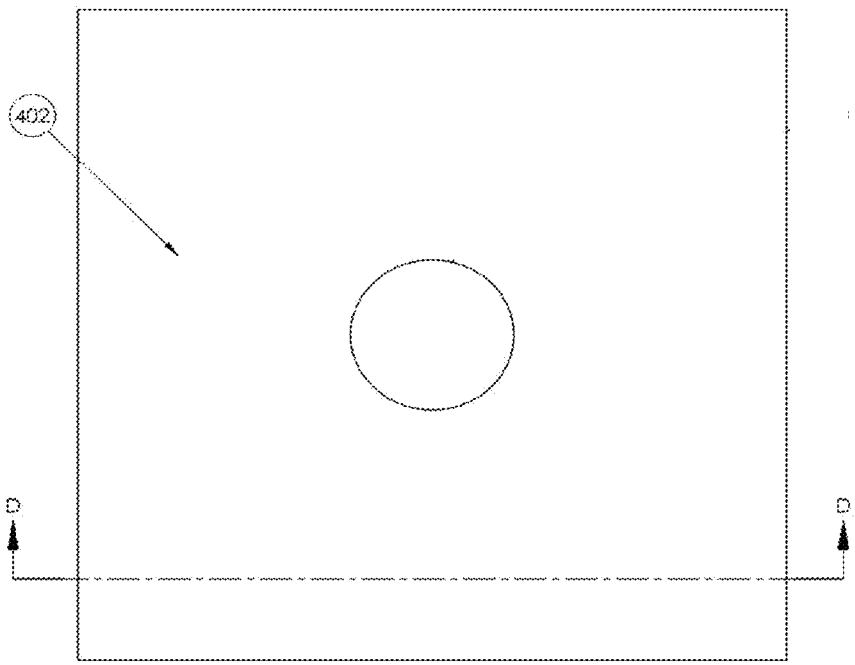
FIG. 4C is a top view illustrating the final structure of Embodiment 4 of the 3-DOF piston-tube electrostatic actuator.
Figure 4D:
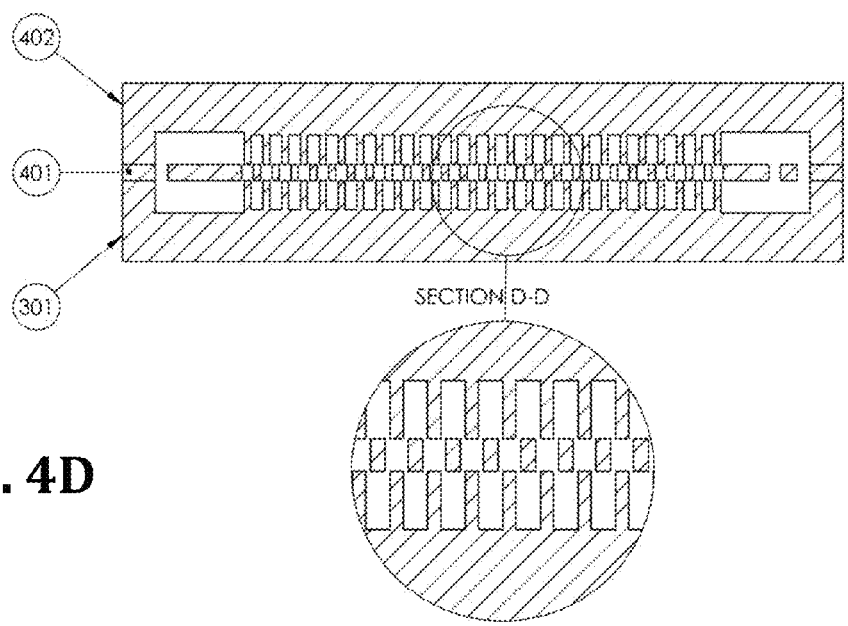
FIG. 4D is a cross-sectional view illustrating the final structure of Embodiment 4 of the 3-DOF piston-tube electrostatic actuator.

The rotor plate is fabricated in another Si wafer 317 having a thickness. The tubes are etched inside the wafer in four groups or subarrays, 310. The tubes are rectangular through holes that are sized to fit the corresponding pistons. Each tube facing a piston so that the pistons penetrate into the tubes during the actuation. A supporting frame 320 on the rotor plate holds the section with the tubes. The tubes are movably attached to the supporting frame by one or more springs, 312, 313, 314, 315. FIG. 3C-3E illustrates a completed actuator, wherein a rotor plate 317 is bonded on the top of the stator late 301 such that all of the tube electrodes are aligned right on the top of the piston electrodes through springs. Therefore, during actuation pistons 319 penetrate into the tubes 318.

It is clear that any number of stator and rotors can be fabricated in this configuration. In another embodiment, the rotor could be supported by two or more springs. This design is more area-efficient in terms of the overall electrodes capacitance than Embodiment 2 in which the corners of the actuator are not utilized due to the geometry of the circular rotor. It also utilizes an efficient spring or supporting beam configuration similar to the one used in embodiment 2. However, the rotation angle of this embodiment is limited due to the change of the horizontal gap between adjacent pistons and tubes, especially, when the actuator plate is rotated towards the corners of the actuator. The actuator plate and the base plate may have through hole such that an optical element 316 (lens) is attached to the through hole of the actuator plate and allow the penetration of the light. The rotor could actuate the lens (or lenses) in the 3 degrees of freedom motion (i.e. translation along z direction and biaxial rotation about the in-plane axes x and y) to achieve the autofocus and/or optical image stabilization.

Embodiment 4

The goal of this embodiment, illustrated in FIG. 4, is to double the translation stroke of the actuator described in Embodiment 3. A base 402 with a central open hole and which has the same features as the lower base 301 of the actuator in Embodiment 3 is bonded to the top surface of the rotor 401. The bonding of this base 402 enables the actuator rotor 401 to translate along the z-axis. Therefore, the stroke of the actuator is doubled as the actuator provides a bi-directional translation. In the rotation mode of the actuator, the torque developed between the rotor and the lower and upper stators increases as more piston-tube pairs are used to generate forces acting on the rotor edges. Therefore, a lower input voltage is required to rotate the rotor. However, bonding misalignments are expected between the upper base 402 pistons and the rotor 401 tubes because the bonding is done after etching the features of both structures (upper base and the rotor). The rotor 401 is attached after bonding to the lower based 301 using backside alignment.

Figure 5A:
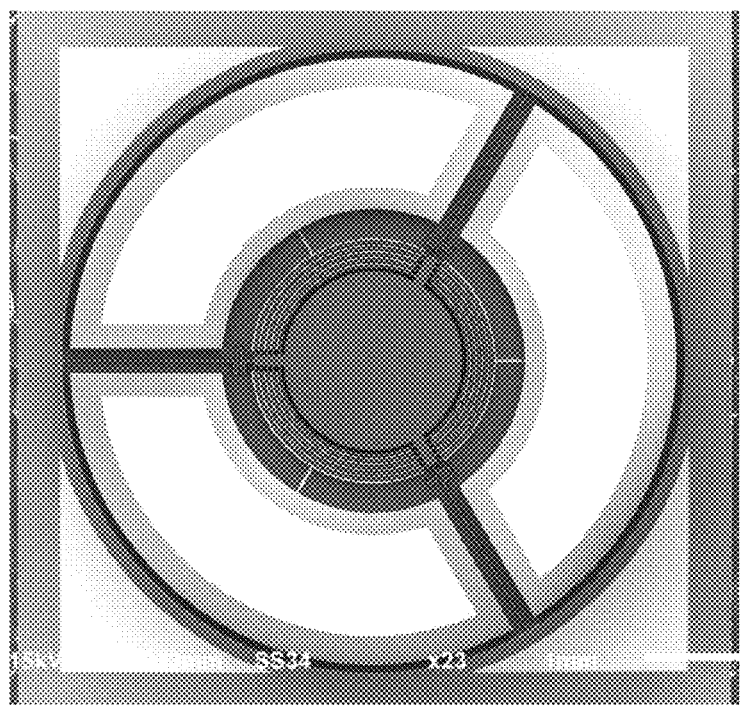
FIG. 5A is an SEM micrograph illustrating the top view of the fabricated prototype of Embodiment 1 of the 3-DOF piston-tube electrostatic actuator.
Figure 5B:
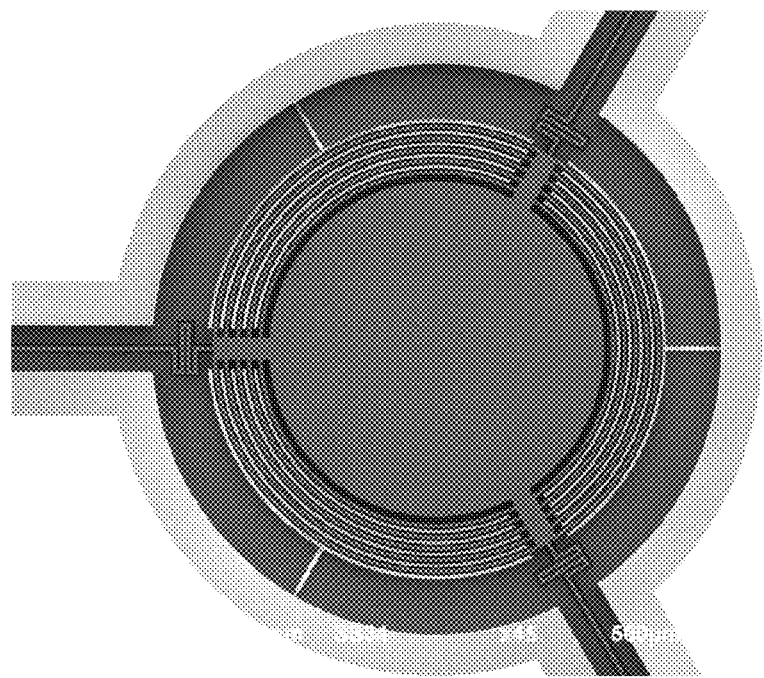
FIG. 5B is an SEM micrograph illustrating the top view of the rotor and the stator of the fabricated prototype of Embodiment 1 of the 3-DOF piston-tube electrostatic actuator.
Figure 5C:
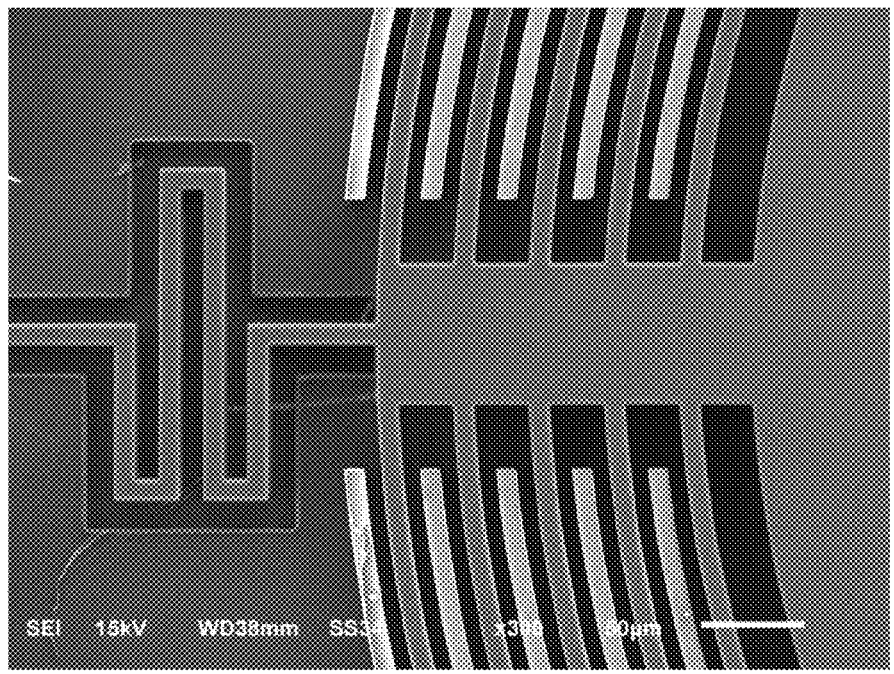
FIG. 5C is an SEM micrograph illustrating a magnified top view of part of the rotor and the stator and a spring of the fabricated prototype of Embodiment 1 of the 3-DOF piston-tube electrostatic actuator.
Figure 5D:
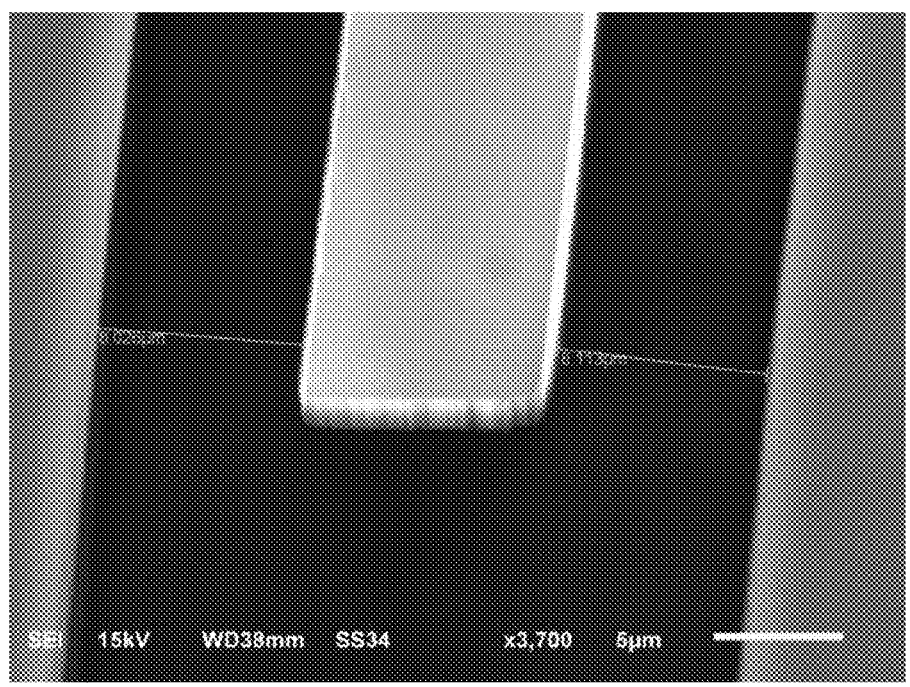
FIG. 5D is an SEM micrograph illustrating the alignment accuracy of the fabricated prototype of Embodiment 1 of the 3-DOF piston-tube electrostatic actuator.

G.5 shows Scanning Electron Microscope (SEM) snapshots from the top side of Embodiment 1 of the actuator, and the alignment accuracy between the electrodes of the actuator was also investigated using the SEM. FIG. 5D indicates that a high alignment accuracy between the adjacent pistons and tubes was achieved as the misalignment is less than 0.005% of the horizontal gap 126 between the electrodes.

Figure 6:
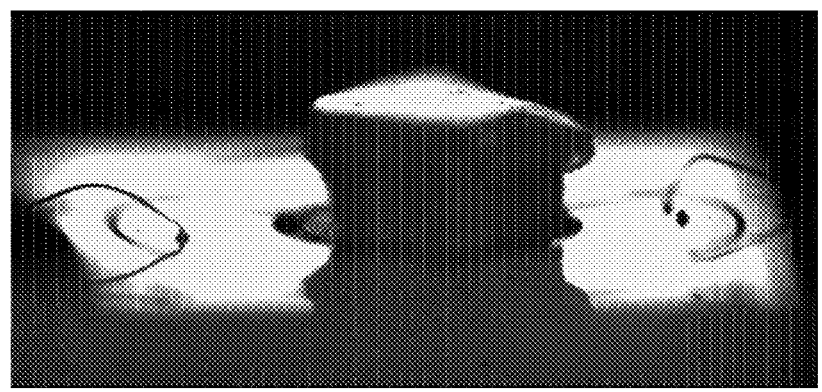
FIG. 6 shows a snapshot of the prototype actuator of Embodiment 1 of the 3-DOF piston-tube electrostatic actuator loaded with a mass of 1 mg during output force testing.
Figure 7:
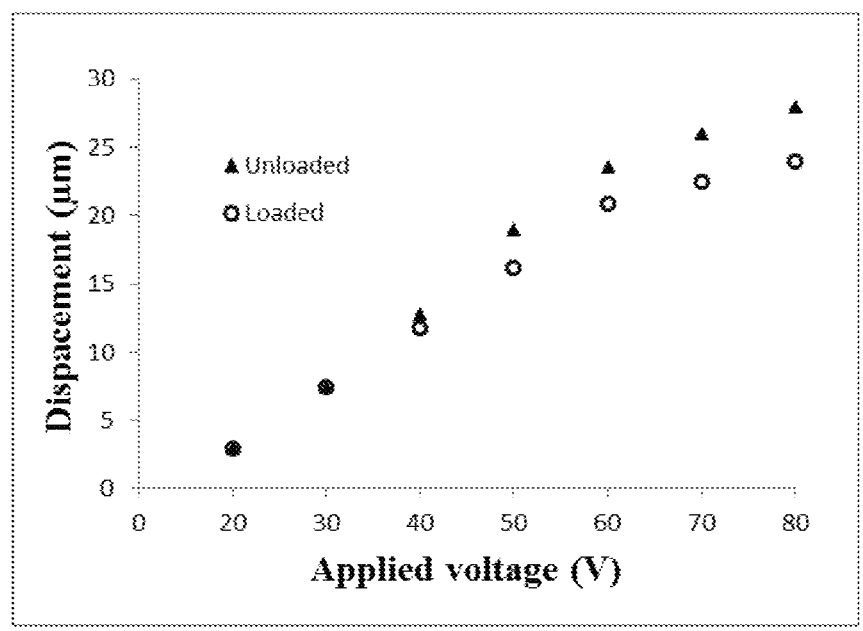
FIG. 7 shows the translational stroke of the fabricated prototype actuator versus applied voltage.

An output force test was conducted on the prototype of Embodiment 1 of the actuator by assessing its static performance when it is loaded with 1 mg mass. The load is placed on the actuator plate using tweezers and then repositioned at the center of the plate using a needle. FIG. 6 is a snapshot of the 1 mg mass loaded actuator during the output force testing. FIG. 7 shows the measured displacements of the loaded actuator versus the applied voltages. The actuator was able to vertically translate the mass load (1 mg) for 24 µm.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

With respect to the above description, it is to be realized that the optimum relationships for the parts of the invention in regard to size, shape, form, materials, function and manner of operation, assembly and use are deemed readily apparent and obvious to those skilled in the art, and all equivalent relationships to those illustrated in the drawings and described in the specification are intended to be encompassed by the present invention.

REFERENCES

[1] R. C. Gutierrez, E. R. Fossum, and T. K. Tang, "Auto-Focus Technology," in the 2007 *International Image Sensor Workshop,* 2007.
[2] M. Eromäki, "Optical image stabilization," WO 2013076350 A1.
[3] D. J. Dagel, W. D. Cowan, S. Member, O. B. Spahn, G. D. Grossetete, A. J. Griñe, M. J. Shaw, P. J. Resnick, and B. Jokiel, "Large-Stroke MEMS Deformable Mirrors for Adaptive Optics," vol. 15, no. 3, pp. 572-583, 2006.
[4] Digital Optics Corporation, "Advances in Autofocus Camera Technologies made possible by MEMS," 2012.
[5] B. S. Kim, J. S. Park, C. Moon, G. M. Jeong, and H. S. Ahn, "A precision robot system with modular actuators and MEMS micro gripper for micro system assembly," *J. Mech. Sci. Technol.,* vol. 22, no. 1, pp. 70-76, April 2008.
[6] A. P. Lee, D. R. Ciarlo, P. A. Krulevitch, S. Lehew, J. Trevino, and M. a. Northrup, "A Practical Microgripper By Fine Alignment, Eutectic Bonding And Sma Actuation," *Proc. Int. Solid-State Sensors Actuators Conf.—TRANSDUCERS '95,* vol. 2, pp. 368-371, 1995.
[7] D. J. Bell, T. J. Lu, N. A. Fleck, and S. M. Spearing, "MEMS actuators and sensors: observations on their performance and selection for purpose," *J. Micromechanics Microengineering,* vol. 15, no. 7, pp. S153-S164, July 2005.
[8] D. A. Henderson, "Micro-Scale Smart Actuator Modules for Imaging Systems," in *ACTUATOR* 2012, 2012, no. June.
[9] C. Liu, "Electrostatic Actuation," in *Foundations of MEMS,* Second., 2005, pp. 127-168.
[10] J. Li, "Electrostatic Zipping Actuators and Their Application to MEMS," *Thesis,* 2004.
[11] V. Milanovic, G. a. Matus, and D. T. McCormick, "Gimbal-Less Monolithic Silicon Actuators for Tip-Tilt-Piston Micromirror Applications," *IEEE J. Sel. Top. Quantum Electron.,* vol. 10, no. 3, pp. 462-471, May 2004.
[12] Y. Li, D. Psychogiou, S. Kiihne, J. Hesselbarth, C. Hafner, and C. Hierold, "Large Stroke Staggered Vertical Comb-Drive Actuator for the Application of a Millimeter-Wave Tunable Phase Shifter," *J. MICROELECTROMECHANICAL Syst.,* vol. 22, no. 4, pp. 962-975, 2013.
[13] G. W. Roman C. Gutierrez, "Lens Barrel with MEMS Actuator," US 2012121242A12012.

[14] S. He and R. Ben Mrad, "Translating and Rotation Micro Mechanism," U.S. Pat. No. 8,269,395 B22011.
[15] E. Carr, S. Olivier, and O. Solgaard, "Large-Stroke Self-Aligned Vertical Comb Drive Actuators for Adaptive Optics Applications," *SPIE*, vol. 6113, p. 61130T-61130T9, January 2006.
[16] R. L. clarck, J. A. Hammer, and J. R. Karpinsky, "Vertical Comb drive Actuated Deformable Mirror Device and Method," U.S. Pat. No. 6,384,952 B12002.
[17] K. Akira, M. Yoshihiro, and K. Osamu, "Microactuator Having Increased Rigidity with Reduced Mass," U.S. Pat. No. 7,538,471 B22009.

What is claimed is:

1. A micro electromechanical system (MEMS) electrostatic actuator, comprising:
   a. a stator plate having an x- and y-axis defining an x-y plane, and a z-direction being perpendicular to the x-y plane, said stator plate having
      a top surface and a thickness,
      a stator-support-frame surrounding the stator plate,
      an array of spaced apart pistons extending upwardly from the top surface of the stator plate, said pistons having vertical piston-walls and a piston-height,
      wherein said array of pistons comprising of multiple subarrays of pistons,
      the pistons in each subarray of pistons being electrically connected to each other,
      the pistons in each subarray of pistons being electrically insulated from the pistons in other subarrays of pistons, and
      wherein each subarray of pistons being electrically addressable; and
   b. a rotor plate having
      a non-moving rotor-support-frame surrounding the rotor plate, wherein said rotor-support-frame is placed on and attached to said stator-support-frame,
      an array of spaced apart tubes open on both ends fabricated in the rotor plate, each said tube having a vertical tube-wall and a tube-height, wherein said tubes being vertically aligned with said pistons, and wherein each said tube having a tube opening sized and shaped to receive and interdigitate with each said piston without the piston-walls touching the tube-walls during a rotation,
      said tubes being electrically connected to each other,
      a plurality of springs connecting said array of tubes to said non-moving rotor-support-frame, wherein during an actuation in response to electrostatic forces from a drive voltage applied between one or more subarrays of pistons and the rotor plate, the rotor translates along the z-direction and tilts around the two x and y axes, and
      an actuator-plate located on said rotor plate and surrounded by said tubes, wherein said actuator plate forms a single rigid body with said tubes, and wherein said actuator provides motion with 3 degrees of freedom including one translational and two rotational motions by selectively actuating said subarrays of pistons.

2. The MEMS electrostatic actuator of claim 1, wherein each subarray of pistons being electrically insulated from other subarrays by utilizing an insulating layer in the thickness of the said stator plate.

3. The MEMS electrostatic actuator of claim 1, wherein the cross-section along the plane defined by the x and y axes of each said piston and each said tube being substantially rectangular, circular, triangular, trapezoidal, pentagonal, or hexagonal shaped, and each said tube being sized to let each said piston to enter the tube opening without touching said tube-walls.

4. The MEMS electrostatic actuator of claim 1, wherein said array of pistons and said array of tubes comprising of multiple linear rows of pistons and tubes aligned along the x- and y-axis.

5. The MEMS electrostatic actuator of claim 1, wherein said array or subarrays of pistons and said array of tubes comprising of multiple concentric circular rows of pistons and tubes, wherein said pistons and tubes are aligned both radially and circumferentially.

6. The MEMS electrostatic actuator of claim 1, wherein said array or subarrays of pistons and said array of tubes arranged in multiple sectors, wherein said pistons and tubes are aligned both radially and circumferentially in each said sector.

7. The MEMS electrostatic actuator of claim 1, further having an object placed on the rotor,
   whereby said object can move along the z-direction and rotate around the x-axis and y-axis by selectively actuating said subarrays of pistons and said array of tubes.

8. The MEMS electrostatic actuator of claim 1, wherein said rotor plate having a rotor-opening, and said stator plate having a stator-cavity, whereby an object can be placed in the rotor-opening and be vertically translated into and rotated in the stator-cavity.

9. The MEMS electrostatic actuator of claim 8, wherein said stator-cavity being an open cavity to allow light to penetrate through the actuator, and wherein said object being an optical lens or a plurality of lenses.

10. The MEMS electrostatic actuator of claim 8, wherein said stator cavity being an open cavity to allow light to penetrate through the actuator, and wherein said actuator integrated in a miniature camera, whereby the actuator is used for autofocus and optical image stabilization in said camera.

11. The MEMS electrostatic actuator of claim 1, wherein said plurality of springs being aligned longitudinally along said rotor-support-frame.

12. The MEMS electrostatic actuator of claim 1, wherein at least two subarrays of pistons being symmetrically fabricated on both sides of the x-axis for rotation around the x-axis, and at least two subarrays of pistons being symmetrically fabricated on both sides of the y-axis for rotation around the y-axis.

13. The MEMS electrostatic actuator of claim 12, wherein each said piston having a rectangular cross section with a long side and a short side, and wherein said long sides of the pistons in said subarrays of pistons for rotation around the x-axis being parallel to the y-axis, and said long sides of the pistons in said subarrays of pistons for rotation around the y-axis being parallel to the x-axis, thereby providing a large rotational stroke actuation without the piston-walls touching the tube-walls.

14. The MEMS electrostatic actuator of claim 1, wherein said MEMS actuator stator is fabricated in a SOI wafer using a Direct Reactive Ion Etching (DRIE) bulk micromachining process.

* * * * *